(12) United States Patent
Merz et al.

(10) Patent No.: US 9,599,658 B2
(45) Date of Patent: Mar. 21, 2017

(54) METHOD AND APPARATUS FOR SIGNALING PARTIAL SHADOWING OF A PHOTOVOLTAIC GENERATOR

(71) Applicant: SMA Solar Technology AG, Niestetal (DE)

(72) Inventors: Christopher Merz, Kassel (DE); Sebastian Bieniek, Frankenberg (DE); Markus Hopf, Espenau (DE); Felix Eger, Kassel (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 225 days.

(21) Appl. No.: 14/499,585

(22) Filed: Sep. 29, 2014

(65) Prior Publication Data

US 2015/0015298 A1 Jan. 15, 2015

Related U.S. Application Data

(63) Continuation of application No. PCT/EP2013/056787, filed on Mar. 28, 2013.

(30) Foreign Application Priority Data

Apr. 4, 2012 (DE) ........................ 10 2012 102 932

(51) Int. Cl.
*H02S 50/10* (2014.01)
*G01R 31/26* (2014.01)
*H01L 31/02* (2006.01)

(52) U.S. Cl.
CPC .... *G01R 31/2605* (2013.01); *H01L 31/02021* (2013.01); *H02S 50/10* (2014.12); *Y02E 10/50* (2013.01)

(58) Field of Classification Search
CPC combination set(s) only.
See application file for complete search history.

(56) References Cited

U.S. PATENT DOCUMENTS

| 7,812,592 B2 | 10/2010 | Prior et al. | |
|---|---|---|---|
| 2010/0052425 A1* | 3/2010 | Moore | H01L 31/02021 307/52 |

(Continued)

FOREIGN PATENT DOCUMENTS

| DE | 9312710 U1 | 10/1993 |
|---|---|---|
| EP | 2388602 A1 | 11/2011 |

(Continued)

OTHER PUBLICATIONS

International Search Report dated Jun. 20, 2013 for international application No. PCT/EP2013/056787.

*Primary Examiner* — Clayton E Laballe
*Assistant Examiner* — Jas Sanghera
(74) *Attorney, Agent, or Firm* — Eschweiler & Associates, LLC

(57) ABSTRACT

The disclosure relates to a method for signaling partial shadowing within a PV generator including at least two partial PV generators connected in parallel. The method includes performing a reference impedance measurement on each of the at least two partial PV generators in a state of uniform irradiation of the PV generator, and determining at least one reference resonant property of each of the at least two partial PV generators from the reference impedance measurement. Furthermore, impedance measurements are carried out on the at least two partial PV generators at a first operating point of the PV generator during operation of the PV generator. Resonant properties of the partial PV generators are determined from the impedance measurements. Partial shadowing within the PV generator is detected and signaled if a difference between the resonant properties of (Continued)

the partial PV generators at the first operating point differs from a difference between the reference resonant properties of the partial PV generators. The disclosure also relates to an apparatus suitable for carrying out the method.

20 Claims, 4 Drawing Sheets

(56)  References Cited

U.S. PATENT DOCUMENTS

| | | | |
|---|---|---|---|
| 2010/0176773 A1* | 7/2010 | Capel | G05F 1/67 323/266 |
| 2012/0043988 A1* | 2/2012 | Ramsey | H02J 13/00 324/761.01 |
| 2012/0049879 A1 | 3/2012 | Crites | |
| 2012/0133208 A1 | 5/2012 | Kalhoff et al. | |

FOREIGN PATENT DOCUMENTS

| | | | |
|---|---|---|---|
| EP | 2388603 | A1 | 11/2011 |
| FR | 2943852 | A1 | 10/2010 |
| WO | 9533283 | A1 | 12/1995 |
| WO | 2012000533 | A1 | 1/2012 |

* cited by examiner

METHOD AND APPARATUS FOR SIGNALING PARTIAL SHADOWING OF A PHOTOVOLTAIC GENERATOR

REFERENCE TO RELATED APPLICATIONS

This application is a continuation of international application number PCT/EP2013/056787, filed on Mar. 28, 2013, which claims priority to German application number 10 2012 102 932.6, filed on Apr. 4, 2012.

FIELD

The disclosure relates to a method for signaling partial shadowing of a photovoltaic generator comprising at least two partial photovoltaic generators connected in parallel. The disclosure also relates to an apparatus for carrying out the method.

BACKGROUND

Photovoltaic generators (called PV generators in abbreviated form below) produce electrical energy with the incidence of light. Inverters are used in order to be able to feed the energy produced by the photovoltaic generators in the form of direct current into a public energy supply network. During the operational control of such inverters, a tracking device—also called a maximum power point (MPP) tracker—is usually used to continuously readjust an operating point of the PV generator, by changing the level of the current flowing through the PV generator, in such a manner that the PV generator is operated at an operating point where maximum power is drawn. The point where maximum power is drawn is a global maximum in a power/voltage characteristic curve (power characteristic curve P(U), where P denotes the delivered power depending on the photovoltaic voltage U of the PV generator).

In the case of partial shadowing of a PV generator, two or more local maxima typically form in the power characteristic curve P(U) of the PV generator. During MPP tracking, the operating point of the PV generator may then be tracked to a local maximum which is not necessarily also the global maximum at which the PV generator should preferably be operated. In practice, this may result in revenue losses of the PV installation.

In order to prevent such a non-optimum operating state existing for a relatively long period of time, it is known practice to interrupt the tracking mode of the MPP tracker at predefined regular intervals of time and to carry out a systematic search for the global maximum of the power characteristic curve P(U). However, unavoidable energy losses also occur when searching for this global maximum since the operating point differs from the global maximum for the majority of the search time for the duration of the search. The magnitude of these energy losses increases with the search frequency, whereas the risk of potential energy losses on account of lingering at a local maximum decreases with the search frequency. A search for a global maximum which is carried out at regular intervals of time can therefore constitute only a compromise solution for preventing excessive energy losses as a result of lingering at a local maximum. It is therefore advantageous to initiate a search for the global maximum only when there are specific indications that the PV generator is not operated at the maximum power operating point. The presence of partial shadowing is such an indication.

The document DE 10 2006 052 295 B3 describes a method and a circuit arrangement for monitoring a PV generator using an impedance measurement. The method is restricted to nighttime hours without irradiation in which the inverter does not feed the network and therefore there is no flow of current in the DC lines of the PV generator. If a change in the impedance of the PV generator is observed with repeated feeding under these conditions, theft or manipulation of the PV generator may be ascertained, for example.

The document EP 2 388 602 A1 discloses a method for monitoring a PV generator using an impedance measurement. In order to determine the impedance of the PV generator, a test signal with a plurality of frequencies is coupled into a DC circuit comprising the PV generator and a response signal is coupled out again. With the knowledge of both signal amplitudes an impedance can be determined from the amplitude ratio of the signals, for example. In this case, the test signal can be coupled in in different ways. On the one hand, the test signal may contain a frequency that is continuously varied during the signal duration. On the other hand, however, a noise signal with a broadband frequency spectrum may also be coupled in. The impedance measurement is analyzed by adapting calculated impedance curves of a model equivalent circuit to the measured impedance profiles in order to determine important parameters of the model equivalent circuit of the PV generator. A change in the determined parameters indicates a change in operating states or properties of the PV generator. The method is particularly suitable for determining faulty operating states, for example contact problems, within the PV generator, but may likewise be used to detect shadowing.

The document WO 2012/000533 A1 discloses a monitoring method for a PV generator comprising a parallel circuit of a plurality of partial PV generators. Impedance measurements of the individual partial PV generators are described in order to be able to locate a fault which has occurred and has been detected using the impedance measurement within the PV generator, on the one hand, and in order to be able to expand the monitoring method in a simple manner with an increase in the size of the installation, on the other hand.

The disadvantage of these methods is that the parameters of the model equivalent circuit can be determined only by means of a complicated analysis of the impedance measurements. In addition, it is difficult and not always clearly possible to infer a particular event, for example partial shadowing, from a change in the parameters.

The document DE 10 2009 029 934 B4 discloses a monitoring device for a PV generator, in which the individual PV modules of the PV generator have measuring devices for performance characteristic data of the PV module as well as a possibly wireless communication interface which can be used to transmit the performance characteristic data to a superordinate control device via a communication network. A comparison of the performance characteristic data of the PV modules allows (partial) shadowing to be detected. However, the practice of equipping each PV module with a measuring device for performance characteristic data and a communication interface leads to a lot of additional components and is costly.

SUMMARY

Therefore, in one embodiment of the present disclosure the occurrence of partial shadowing within a PV generator is detected and signalled in an uncomplicated and reliable manner on the basis of impedance measurements.

A method according to the disclosure of the type mentioned at the outset comprises performing a reference impedance measurement on each of the at least two partial PV generators in a state of uniform irradiation on the PV generator, and determining at least one reference resonant property of each of the at least two partial PV generators from the reference impedance measurement. Furthermore, impedance measurements are performed on the at least two partial PV generators at a first operating point of the PV generator during operation of the PV generator. Resonant properties of the partial PV generators are determined from the impedance measurement. Partial shadowing within the PV generator is detected and signaled if a difference between the resonant properties of the partial PV generators at the first operating point differs from a difference between the reference resonant properties of the partial PV generators.

According to the disclosure, partial shadowing is detected and signaled by comparing impedance measurements on different partial PV generators, taking into account reference impedance measurements. Impedance measurements may be carried out on the partial PV generators during operation without the PV generator having to deviate from its operating point. Shadowing can therefore be detected without energy losses. According to prior art, energy losses can occur as a result of leaving an operating point that under certain circumstances might already be the optimum. The measurements can be evaluated in a simple manner without complex modeling by comparing partial PV generators with one another. Differences between partial PV generators, for example on account of unavoidable production tolerances, are compensated for by taking into account reference impedance measurements, with the result that the partial PV generators can be compared in order to detect shadowing.

In advantageous refinements of the method, the reference resonant property or the resonant property is a reference resonant frequency or a resonant frequency and/or a reference resonant impedance or a resonant impedance. Both variables, the resonant frequency and the resonant impedance, which indicates the impedance at the resonant frequency, can be extracted from the impedance measurements without a large amount of effort.

In another advantageous refinement of the method, a difference between the reference resonant impedances of two partial PV generators is used as a basis for determining and possibly signaling that there is asymmetry in the number of PV modules within the partial PV generators. In this manner, the measurement results arising in the method can be additionally used to obtain information relating to the partial PV generators which allows conclusions to be drawn with regard to defects and/or incorrect installation of the partial PV generators.

In further advantageous refinements, the method additionally comprises performing further impedance measurements on the at least two partial PV generators at a second operating point of the PV generator, in particular an operating point close to a short circuit, during operation of the PV generator. In addition, the method comprises determining resonant properties of the partial PV generators from the impedance measurements at the second operating point. The measurement results obtained at the second operating point may be used, in one refinement, to confirm detected partial shadowing. The reliability when detecting partial shadowing is thus increased. In another refinement, the measurement results obtained at the second operating point may be used to check correct operation of bypass diodes associated with PV modules of the partial PV generators.

An apparatus according to the disclosure for signaling partial shadowing within a PV generator comprising at least two partial PV generators connected in parallel comprises means for carrying out impedance measurements on the individual partial PV generators. The apparatus is set up to carry out a method according to the disclosure in one embodiment. The same advantages as those described above in connection with the method result.

BRIEF DESCRIPTION OF THE DRAWINGS

The disclosure is explained in more detail below using example embodiments and with the aid of six figures, in which.

DETAILED DESCRIPTION

Figure 1:
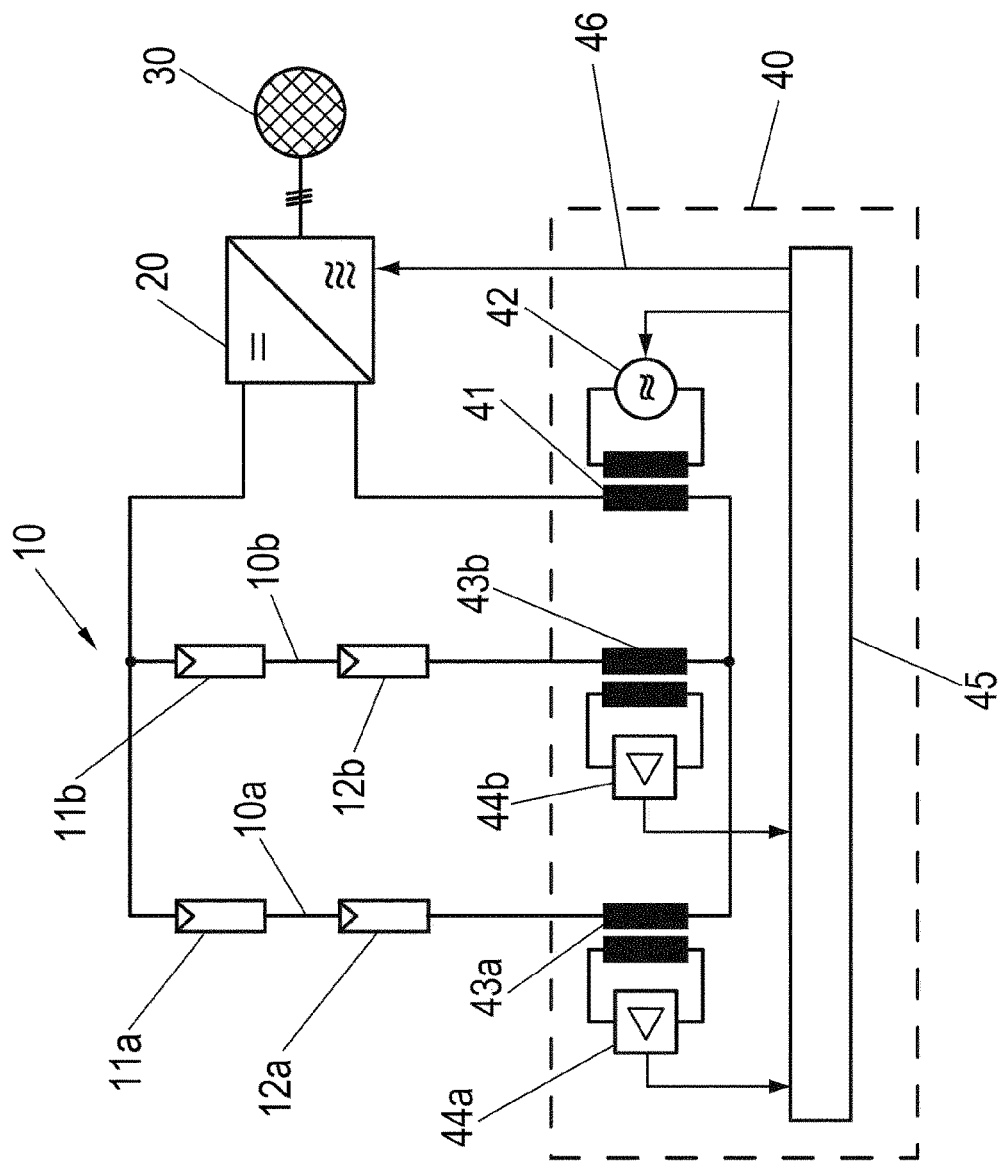
FIG. 1 shows a block diagram of a PV installation having an apparatus for signaling partial shadowing.

FIG. 1 shows a block diagram of a PV installation. The PV installation comprises a PV generator 10 which is connected, via DC lines, to an inverter 20 which is in turn coupled, on the AC side, to an energy supply network 30. By way of example, the inverter 20 is designed for three-phase feeding into the energy supply network 30. It goes without saying that a different number of phases, on which the inverter 20 feeds the energy supply network 30, is likewise possible in alternative refinements. FIG. 1 only illustrates the elements of the PV installation which are essential within the scope of the application. Switching elements (for example isolators), filters (for example sine-wave filters), network monitoring devices and/or transformers (not shown) may be provided, for example, on the AC side of the inverter 20. Elements (not illustrated here), for example protection elements or switching elements, for example load interrupters, DC contactors etc., may likewise be arranged on the DC side in the connection between the PV generator 10 and the inverter 20.

In the example illustrated here, the PV generator 10 comprises a parallel circuit of two partial PV generators 10a and 10b. In the example indicated, each of these partial PV generators 10a, 10b is in the form of a string, that is to say a series circuit comprising a plurality of PV modules. The partial PV generators 10a, 10b are also referred to as strings 10a, 10b below in an abbreviated manner. Each of these strings 10a, 10b comprises a plurality of series-connected PV modules, only two module groups 11a, 12a and 11b and 12b of which are respectively illustrated by way of example in FIG. 1 for each string.

The PV installation also comprises an apparatus 40 for carrying out and evaluating impedance measurements and for detecting and signaling partial shadowing in at least one of the partial PV generators 10a and 10b. The apparatus 40 comprises a coupling-in means 41 which can be used to apply an AC voltage test signal to one of the two DC lines between the PV generator 10 and the inverter 20. In the example embodiment in FIG. 1, the coupling-in means 41 is a transformer, a secondary winding of which is looped into the DC line and a primary winding of which is connected to a signal generator 42. Each of the strings 10a, 10b is also associated with a coupling-out means 43a and 43b which is again in the form of a transformer. A primary winding of the coupling-out means 43a, 43b is respectively connected in series with the PV modules of the two strings 10a, 10b. A respective secondary winding of the coupling-out means 43a, 43b is connected to a respective signal amplifier 44a, 44b.

A control device 45 is also provided, which control device, on the one hand, controls the signal generator 42 and, on the other hand, respectively receives an output signal from the signal amplifiers 44a, 44b for further processing. The control device 45 also comprises an output 46 at which detected partial shadowing is signaled. As illustrated, the output 46 may be coupled to a control input of the inverter 20 in an advantageous refinement in order to initiate a search for a global maximum on a power characteristic curve P(U) of the PV generator 10 when partial shadowing is detected. The search for the global maximum can be carried out here, for example, by means of a complete run through of the voltage-dependent power characteristic curve P(U) of the PV generator 10 and determination of a plurality of characteristic pairs of values {voltage U, power P(U)} thereof (characteristic curve sweep). These can be used to determine the global maximum of the power characteristic curve P(U), which is then approached as the new operating point of the PV generator 10 and is readjusted.

In order to measure the impedance, an AC voltage signal generated by the signal generator 42 is fed into the DC circuit of the PV installation via the coupling-in means 41. The signal which has been fed in is superimposed on a direct current possibly flowing in the DC circuit. Part of the fed-in signal flowing in the strings 10a, 10b is coupled out by the respective coupling-out means 43a, 43b, is amplified by the signal amplifiers 44a, 44b and is forwarded to the control device 45 for evaluation. In an alternative refinement of the apparatus 40, the latter may be partially integrated in the inverter 20. This concerns, in particular, the control device 45 and the signal generator 42, and possibly also the coupling-in means 41 and the signal amplifiers 44a, 44b.

In order to measure an impedance profile, that is to say the dependence of the impedance on the frequency of a signal, the signal generator 42, for example, may output a signal whose frequency is varied with time, for example.

The signal output by the signal amplifiers 44a, 44b is correlated with the alternating current flowing in the DC circuit and is evaluated on the basis of the frequency of the signal generator 42, for example with regard to its respective amplitude. For this purpose, the signal amplifiers 44a, 44b may be rectifying amplifiers which directly detect and forward a signal amplitude or a DC voltage equivalent of the signal. Provided that the voltage of the coupled-in signal is constant in the DC circuit, the measured amplitude characterizes the magnitude of the impedance. Alternatively, in order to determine the impedance in the DC circuit, the level of AC voltage and alternating current may be determined and the impedance may be calculated from the ratio of the two variables.

In an alternative refinement, it is possible that the signal generator 42 emits a broadband noise signal which simultaneously contains a multiplicity of frequency components. In order to determine the frequency-dependent impedance, a tunable bandpass filter present in the evaluation unit 45 or in the signal amplifiers 44a, 44b is then used to detect a signal amplitude within the strings 10a, 10b on the basis of the filter frequency, while the filter frequency is varied.

In another alternative refinement, it is also possible to determine an impedance profile of the partial PV generators 10a, 10b once at the start of the detection of shadowing. This is then used to determine characteristic parameters of the impedance profile, for example a resonant frequency and a magnitude of the impedance minimum. Further continuous measurements are then used to analyze whether—and possibly in which direction—these characteristic parameters of the impedance profile change over the course of time. Therefore, a complete run through of a predefined frequency spectrum is no longer required for these continuous measurements. Rather, a few frequency supporting points in the vicinity of the originally determined resonant frequency can be used to quickly and easily determine whether—and possibly in which direction—a change in these characteristic parameters of the impedance profile has taken place.

In the example embodiment illustrated, the coupling-in means 41 inductively injects the test signal and the coupling-out means 43a, 43b measure an alternating current within the strings 10a, 10b. It goes without saying that the test signal may also be coupled in capacitively as an alternative. The coupling-out means 43a, 43b may also be realized alternatively and/or additionally in the form of voltage-measuring elements.

Figure 2:
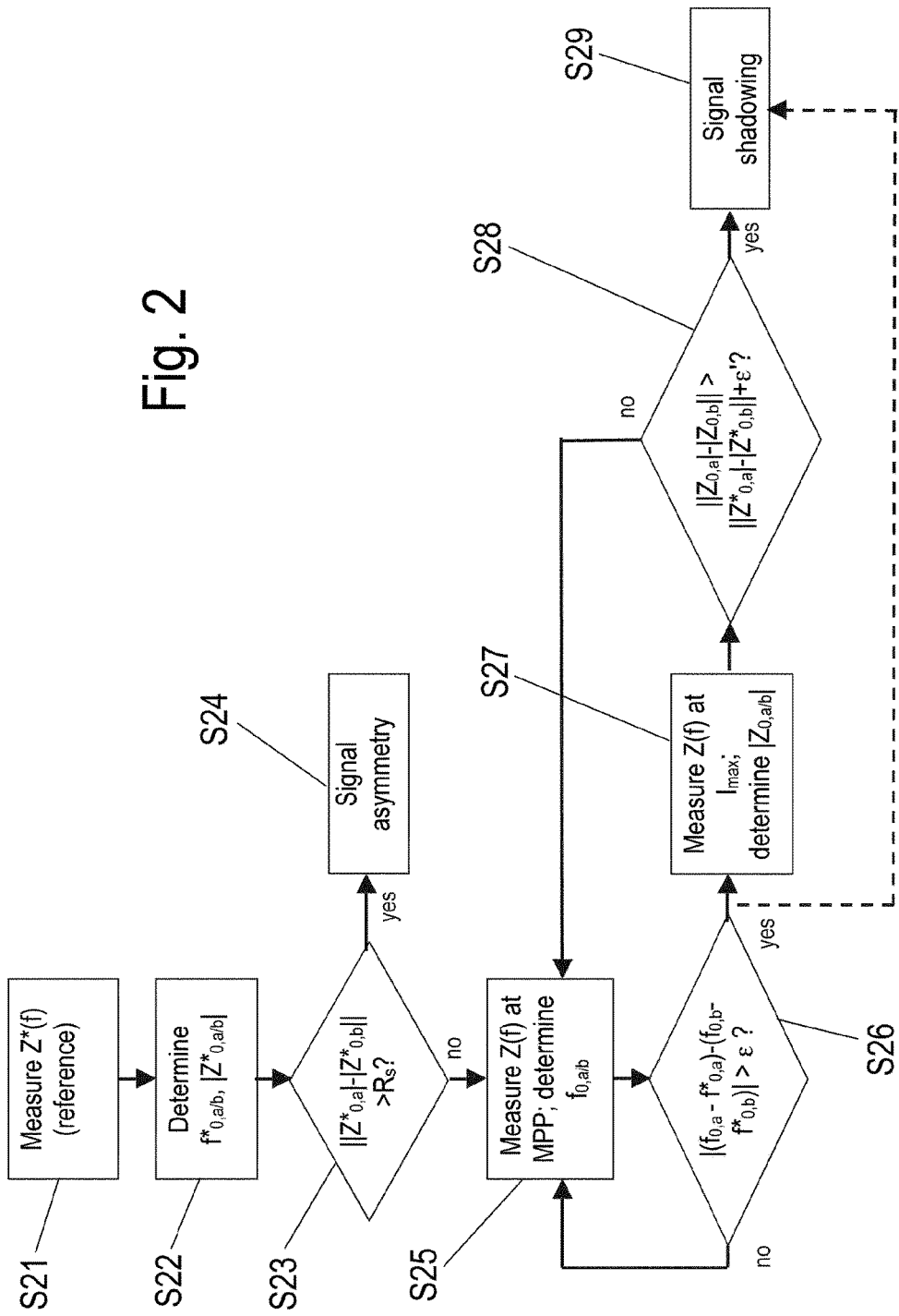
FIG. 2 shows a flowchart of a method for signaling partial shadowing in a first example embodiment.

FIG. 2 is a flowchart to illustrate a method for detecting and signaling partial shadowing of a PV generator, as can be carried out, for example, within the PV installation illustrated in FIG. 1. The reference symbols used in this case relate, for example, to the example embodiment of a PV installation indicated in FIG. 1.

At S21, a reference measurement of impedance profiles $Z^*(f)$ of the strings 10a, 10b is carried out. In this case, it is sufficient in one embodiment to consider only the magnitude of the complex impedance $|Z^*(f)|$ instead of the generally complex impedance $Z^*(f)$. The reference measurements are carried out in a situation of uniform irradiation of the strings 10a, 10b. The reference measurements are in one embodiment dark measurements which are carried out at night, for example, since uniform irradiation can be ensured in the simplest way in this case. As stated in connection with FIG. 1, the measurement of the impedance profile should be understood as meaning the determination of the frequency-dependent impedance within a predefined frequency range. In one example, the frequency range is in the range of a few 10 hertz to a few 100 kilohertz.

At S22, the reference impedance profiles $Z^*(f)$ are evaluated. The frequency profiles of the magnitude-related impedance $|Z^*(f)|$ typically show a resonance-like minimum which is located at a resonant frequency and at which the impedance assumes a minimum value which is referred to as the resonant impedance within the scope of the application. The two values mentioned therefore represent resonant properties of the impedance profiles. The characteristics of the reference impedance profiles are referred to as the reference resonant frequency $f^*_0$ and reference resonant impedance $|Z^*_0|$ below. An additional index a or b in measurements and variables determined therefrom indicates below on which of the strings 10a or 10b the measurement was carried out. If no index is stated, the statement relates to measurements or variables for both strings 10a, 10b.

The values of the reference resonant frequencies $f^*_0$ and of the reference resonant impedances $|Z^*_0|$ may be gathered in a simple manner from the measured impedance profiles $|Z^*(f)|$ without a complicated evaluation operation. The values are stored, for example in a memory of the control device 45. As an alternative to storing the extracted values for reference resonant frequencies $f^*_0$ and the reference resonant impedances $|Z^*_0|$, difference values of these values of the different strings 10a, 10b may be stored, that is to say the difference between the reference resonant frequencies $(f^*_{0,a}-f^*_{0,b})$ and the difference between the reference resonant impedances $|Z^*_{0,a}|-|Z^*_{0,b}|$. In this case, the difference values are formed and stored in pairs for the possible combinations of partial PV generator pairs. On account of the storage in pairs, storage of the difference values is suitable for PV installations having a rather small number of partial PV generators inside the PV generator.

A next act S23 determines whether the absolute value of the difference $||Z^*_{0,a}|-|Z^*_{0,b}||$ between the reference resonant impedances $|Z^*_{0,a}|$ and $|Z^*_{0,b}|$ is greater than a typical series resistance $R_S$ of a PV module. If such a difference is detected (YES), this indicates that one of the strings 10a or 10b comprises at least one PV module less than the other string. This may arise, for example, from an installation error or else a short circuit, for example in a connection box of a PV module. Such asymmetry is indicated at S24. Provision may be made for the method to be ended at S24 with an indication of the asymmetry which has been found. Alternatively, the method may be continued at S25 which is likewise used to continue the method if the condition for branching at S24 has not been found (NO at S23). Acts S23 and S24 are also optional and are not necessarily part of a method according to the application for detecting and signaling partial shadowing.

At S25, measurements of impedance profiles Z(f) are now carried out on the partial PV generators, that is to say on the strings 10a, 10b for example, during operation of the PV installation under irradiation conditions. During these measurements, the PV generator is therefore generally at a maximum power operating point (maximum power point/MPP). The measured impedance profiles Z(f) are now evaluated in an analogous manner to act S22 by determining a resonant frequency $f_0$ and a resonant impedance $|Z_0|$, which the partial PV generator has at the resonant frequency $f_0$, for each of the partial PV generators 10a, 10b.

As an alternative to the above description, it is also possible at S25 to measure an impedance profile Z(f) for the individual partial PV generators 10a, 10b only once within a larger—originally predefined—frequency range. This measurement is typically carried out with the inclusion of a larger number of supporting points. These are then used to determine both resonant frequencies $f_0$ and resonant impedances $|Z_0|$ for the individual partial PV generators 10a, 10b. For the subsequent measurements, it is now sufficient, on the basis of the initially determined resonant frequencies $f_0$ and resonant impedances $|Z_0|$, to track their change over time in a smaller frequency range in the area surrounding the initially determined resonant frequency $f_0$. This allows the subsequent measurements to be carried out with a considerably smaller number of supporting points and therefore more quickly.

In principle, it is also possible to track the temporal profile of the resonant frequencies $f_0$ and of the resonant impedances $|Z_0|$ for the individual partial PV generators 10a, 10b in a tracking method. Here, the corresponding impedance $|Z(f)|$ is measured on the basis of the current supporting point (for example the resonant frequency $f_0$ of the previous measurement) at an adjacent point, for example below the resonant frequency $f_0$ of the previous measurement. If this value is less than the impedance of the last measurement, the adopted direction strives toward an impedance minimum $|Z_0|$ and the frequency f is varied further in the same direction. In contrast, if the impedance at this point is greater than the previous measured value, the frequency is varied in the opposite direction starting from the resonant frequency determined last. This method can be used to track the temporal profile of the resonant frequencies $f_0$ and the resonant impedances $|Z_0|$ for the individual partial PV generators 10a, 10b with a minimum amount of measurement and evaluation complexity.

A next act S26 now checks whether—starting from the position of the reference resonant frequencies $f^*_{0,a}$ and $f^*_{0,b}$ with respect to one another—the resonant frequencies $f_{0,a}$ and $f_{0,b}$ of both strings 10a and 10b are shifted relative to one another. On account of measurement uncertainties which are always present, it is expedient here to define a tolerance range with the width of a tolerance value $\epsilon$, the exceeding of which results in a shift of the resonant frequencies $f_{0,a}$ and $f_{0,b}$ relative to one another being deemed to be significant. In order to remain again at the example in FIG. 1, a check is carried out in order to determine whether the positions of the resonant frequency $f_{0,a}$ and $f_{0,b}$ of both strings 10a, 10b relative to one another are significantly different during operation than during the reference measurements, that is to say whether either $(f_{0,a}-f_{0,b})$ is less than $(f^*_{0,a}-f^*_{0,b})-\epsilon$ or $(f_{0,a}-f_{0,b})$ is greater than $(f^*_{0,a}-f^*_{0,b})+\epsilon$. In another representation, these two criteria may be combined in one inequality. In the latter, a check is carried out in order to determine whether the absolute value of a difference between the disparity between the resonant frequency $f_{0,a}$ of the first string 10a and the associated reference resonant frequency $f^*_{0,a}$ and the disparity between the resonant frequency $f_{0,b}$ of the second string 10b and the associated reference resonant frequency $f^*_{0,b}$ is greater than the tolerance value $\epsilon$, that is to say whether $$|(f_{0,a}-f^*_{0,a})-(f_{0,b}-f^*_{0,b})|>\epsilon.$$

If this is the case (YES at S26), partial shadowing can be assumed, which partial shadowing is signaled to the inverter at S29 and excites the inverter to start a complete run through of the power characteristic curve P(U), for example. In one advantageous embodiment of the method, the run through of the power characteristic curve P(U) is initiated only when longer lasting shadowing is present. This prevents unnecessary runs through the power characteristic curve P(U) in the case of very brief shadowing events. Otherwise (NO at S26), the method branches back to S25 in which impedance measurements are carried out and evaluated again.

It is optionally possible to carry out a plausibility check on a shadowing event detected at S26. For this purpose, acts S27 and S28 are carried out between acts S26 and S29. For this purpose, the impedance profile Z(f) is deliberately measured at high currents, in particular in the vicinity of the short circuit of the PV generator, at S27. At this operating point, the shadowed PV modules of the partial PV generators are bridged by bypass diodes. In the case of a partially shadowed partial PV generator, a significant decrease in the associated impedance minimum $|Z_0|$ can therefore be observed. In the case of partial shadowing of a partial PV generator, the absolute value of the difference between the impedance minima $||Z0,a|-|Z0,b||$ of individual partial PV generators 10a, 10b therefore also changes. In particular, this difference becomes greater than that of the associated reference measurement $||Z^*0,a|-|Z^*0,b||$. After this criterion has been successfully checked at S28, the method then branches to S29 and the shadowing is signaled to the inverter. If, in contrast, the criterion has not been satisfied, for example on account of relatively fast-moving partial shadowing which was present at S26 but was no longer present shortly thereafter, a complete run through the power characteristic curve P(U) of the PV generator is no longer necessary. In this case, the method branches back to S25 again in which impedance measurements are again carried out and evaluated at the MPP operating point of the PV generator.

At S28 too, it is possible to provide, during the check, a tolerance value ϵ'>0 by which difference values must at least differ before the method branches to S29. It is pointed out that the criterion at S26 can be effected both on the basis of stored reference resonant frequency values and on the basis of stored differences between the reference resonant frequency values of individual partial PV generators. A corresponding situation likewise applies at S28. If the PV generator comprises considerably more than two, in particular more than four, partial PV generators, the reference resonant frequencies $f^*_0$ and the associated reference resonant impedances $|Z^*_0|$ are preferably stored. The corresponding difference formations and the comparisons of two partial PV generators with one another are then carried out by means of a suitable mathematical algorithm for all possible combinations of the partial PV generators.

Figure 3:
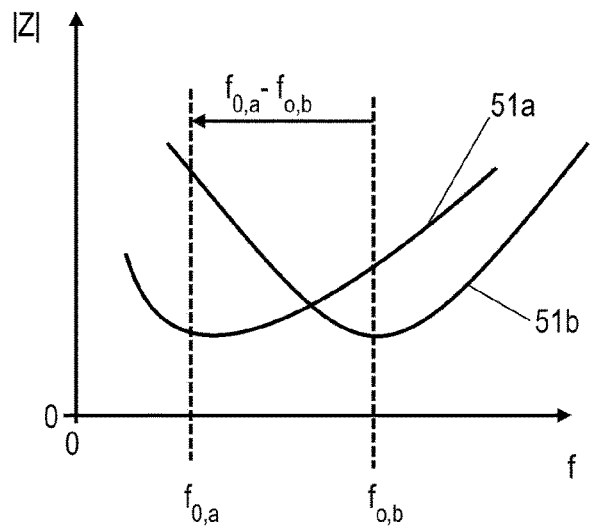
FIGS. 3 to 5 show an illustration of different impedance profiles of partial PV generators when there is partial shadowing in different operating states of the PV generator.
Figure 4:
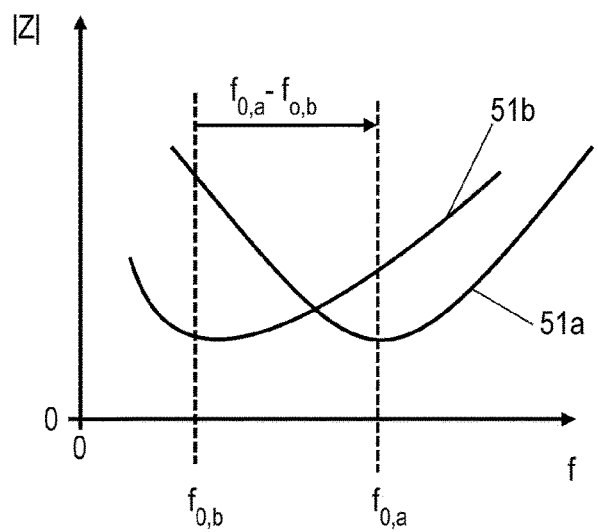

In order to illustrate and give reasons for the illustrated method, FIGS. 3 and 4 each reproduce two measured impedance profiles Z(f) as impedance curves 51a, 51b when there is partial shadowing of a PV generator. The magnitude of the impedance |Z| is respectively illustrated on the ordinate of the graph as a function of the frequency f on the abscissa of the graph.

The impedance curve 51a reproduces, for example, the impedance profile of the string 10a of the PV installation in FIG. 1 in a situation in which some of the PV modules, for example the PV modules 12a, are shadowed, while other modules, that is to say the PV modules 11a for example, are irradiated without impairment. The impedance curve 51b in FIGS. 3, 4 reproduces the impedance curve of the unshadowed string, for example the string 10b from FIG. 1, in which all PV modules 11b and 12b are irradiated without impairment with the same intensity as the PV modules 11a of the string 10a. For the sake of simpler explanation, it is assumed below that the reference impedance measurements Z*(f) for both strings 10a, 10b proceed in the same manner and have, in particular, the same values for the reference resonant frequencies $f^*_{0,a}$ and $f^*_{0,b}$. The criterion at S27 is then simplified to the effect that a branch is effected if the difference $(f_{0,a}-f_{0,b})$ between the resonant frequencies of the two strings 10a, 10b is greater than zero or greater than c or else less than (−ϵ).

In the case of an irradiation situation in which one of two parallel-connected partial PV generators 10a, 10b is partially shadowed, two local maxima form in the power characteristic curve P(U) of the PV generator 10. The operating point of the PV generator 10 is typically set by a tracking device, the MPP tracker mentioned at the outset, which is integrated in the inverter 20. In the case of the partial shadowing, one of the two local maxima of the power characteristic curve P(U) can be set as the operating point depending on the temporal profile of the formation of the partial shadowing and also depending on the tracking method used.

FIG. 3 reproduces a situation in which the operating point was tracked to the local maximum at the lower voltage (LV-MPP—low voltage maximum power point) of the PV generator 10. FIG. 4 reproduces the corresponding situation when the local maximum at the higher voltage is set.

The LV-MPP, as illustrated in FIG. 3, is characterized by a relatively high current intensity at a low voltage of the partial PV generator. In this case, the unshadowed PV modules 11a of the partially shadowed string 10a operate approximately unchanged at the operating point present before shadowing occurred, the flow of current through the shadowed PV modules 12a being guided by bypass diodes integrated in the modules. Therefore, the shadowed modules 12a contribute to the total impedance in the string 10a, which is relatively small, only with the impedance of the bypass diodes. Bridging the shadowed PV modules 12a results in some partial capacitances being dropped in the series connection of the string 10a, as a result of which the capacitance of the string 10a is increased only slightly. In a corresponding manner, the resonance minimum $f_{0,a}$ is shifted only insignificantly to lower frequencies. In the case of the unshadowed string 10b, a higher current than before shadowing is established since the operating point has been shifted to a lower voltage and the current/voltage characteristic curve of PV modules falls monotonously. With the higher current, the resonance minimum $f_0$ of the impedance profile is shifted to higher frequencies. This can be discerned from the resonance minimum $f_{0,b}$ which is at considerably higher frequencies in the impedance curve 51b.

In the case illustrated in FIG. 4, the MPP tracker has guided the operating point to the local maximum with the higher voltage, the so-called high voltage maximum power point (HV-MPP). Here, the bypass diodes of the shadowed PV modules are deactivated and the situation is reversed. The voltage of the PV generator changes only slightly in comparison with the unshadowed situation, but the current falls considerably. As a result of the fact that the current is low, it can also be produced by the shadowed PV modules 12a, with the result that their bypass diodes do not become active. The impedance profile of the shadowed modules changes toward higher frequencies and dominates the impedance profile in the entire partially shadowed string 10a. In contrast, the profile of the impedance does not change significantly in the unshadowed string 10b. As a result, a higher resonant frequency $f_{0,a}$ for the partially shadowed string 10a is observed, whereas the resonant frequency $f_{0,b}$ of the unshadowed string 10b has not changed significantly in comparison with the unshadowed case. However, in both cases, spreading of the resonant frequencies $f_{0,a}$, $f_{0,b}$ can be observed, as a result of which the difference $(f_{0,a}-f_{0,b})$ between the resonant frequencies of the two strings 10a, 10b in both cases either becomes greater than zero or greater than c or else less than (−ϵ). The criterion at S26 in FIG. 2 is thus satisfied and the method is continued at S29 or optionally at S27.

Act S27 and a subsequent act S28 are optional and are used as an additional criterion for verifying the partial shadowing in addition to the criterion checked at S26. For this purpose, impedance profiles Z(f) for the partial PV generators are measured at S27 with a relatively high current $I_{max}$ through the PV generator. In particular, this relatively high current is at least approximately equal to the short-circuit current intensity of the PV generator. In this case, this relatively high current $I_{max}$ can be set, for example, by the inverter 20 by virtue of the latter leaving the previous operating point for the PV generator 10 and at least approximately setting a short circuit at its DC inputs. A resonant impedance $|Z_0|$ for the partial PV generators, that is to say the strings 10a, 10b in the example in FIG. 1, is respectively determined from the measured impedance profiles Z(f).

Act S28 now checks whether an absolute value of a difference between two determined resonant impedances is greater than an absolute value of the difference between corresponding reference resonant impedances of the same partial PV generators. Again explained using the example in FIG. 1, a check is therefore carried out in order to determine whether differences in the resonant impedance $|Z_{0,a}|$ and $|Z_{0,b}|$ of the two strings 10a, 10b during operation are greater than during the reference measurements, that is to say whether $\|Z_{0,a}|-|Z_{0,b}\|$ is greater than $\|Z^*_{0,a}|-|Z^*_{0,b}\|$. If this criterion is satisfied, this can be considered to be a further indication of the presence of partial shadowing and the method branches to a step S29 in which this partial shadowing is signaled. In contrast, if the criterion is not satisfied, no confirmation of the result of step S26 is found and the method branches back to step S25 in order to carry out measurements of impedance profiles 52a, 52b again in the operating state of the PV generator. For this purpose, a previously set operating point, for example an MPP, is set by the inverter 20 again. In a similar manner to the comparison of the resonant references $f_0$, a tolerance value $\epsilon'>0$ may be provided in the comparison in order to eliminate any influence of small measurement inaccuracies.

Figure 5:
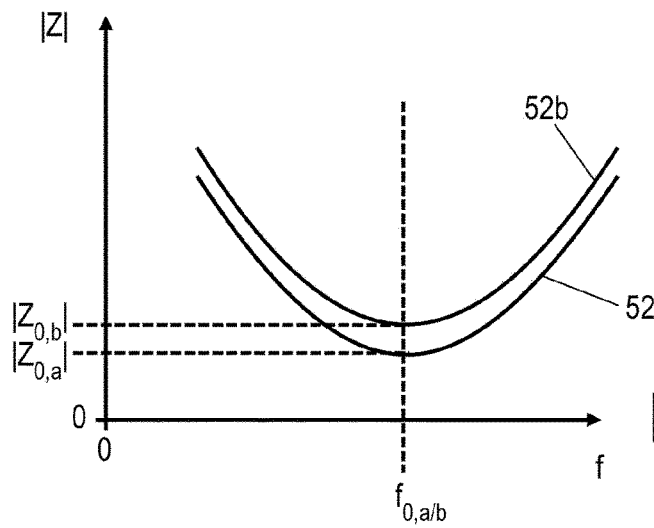

In a similar manner to that in FIGS. 3 and 4, FIG. 5 indicates typical impedance profiles Z(f) as impedance curves 52a, 52b for the (approaching) short-circuit case of the PV generator present at S27. In this case, the impedance curve 52a again reproduces the impedance profile of a partially shadowed PV generator, for example the partially shadowed string 10a of the PV installation in FIG. 1. The impedance profile illustrated with the impedance curve 52b is that of an unshadowed partial PV generator, for example the unshadowed string 10b from the example in FIG. 1. It is again assumed that the corresponding reference impedance measurements Z*(f) proceed in the same manner for both partial PV generators 10a, 10b.

At an operating point in the vicinity of the short circuit, that is to say at an approximately maximum deliverable current $I_{max}$ of the PV generator 10, all unshadowed PV modules 11a, 11b and 12b are in the short-circuit operating state, whereas the shadowed PV modules 12a show the impedance profile of the active bypass diodes. However, the relatively small impedance of the bypass diodes does not contribute to the total impedance in the string 10a or contributes only insignificantly. In the impedance measurement Z(f), the partially shadowed string 10a is thus shorter than the unshadowed string 10b by the number of shadowed PV modules 12a. Therefore, the magnitude of the impedance minimum $|Z_{0,a}|$ for the partially shadowed string 10a is lower than the magnitude of the impedance minimum $|Z_{0,b}|$ for the unshadowed string 10b. In particular, the resonant impedances $|Z_{0,a}|$ and $|Z_{0,b}|$ differ by a multiple of the series resistance $R_S$, this multiple corresponding exactly to the number of shadowed PV modules 12a.

In the example embodiment in FIG. 2, differences between the resonant frequency and resonant impedance determined using the impedance measurements are therefore used to detect and subsequently signal partial shadowing. In an analogous manner to FIG. 2, FIG. 6 indicates another example embodiment of a method for detecting and signaling partial shadowing in a flowchart.

Figure 6:
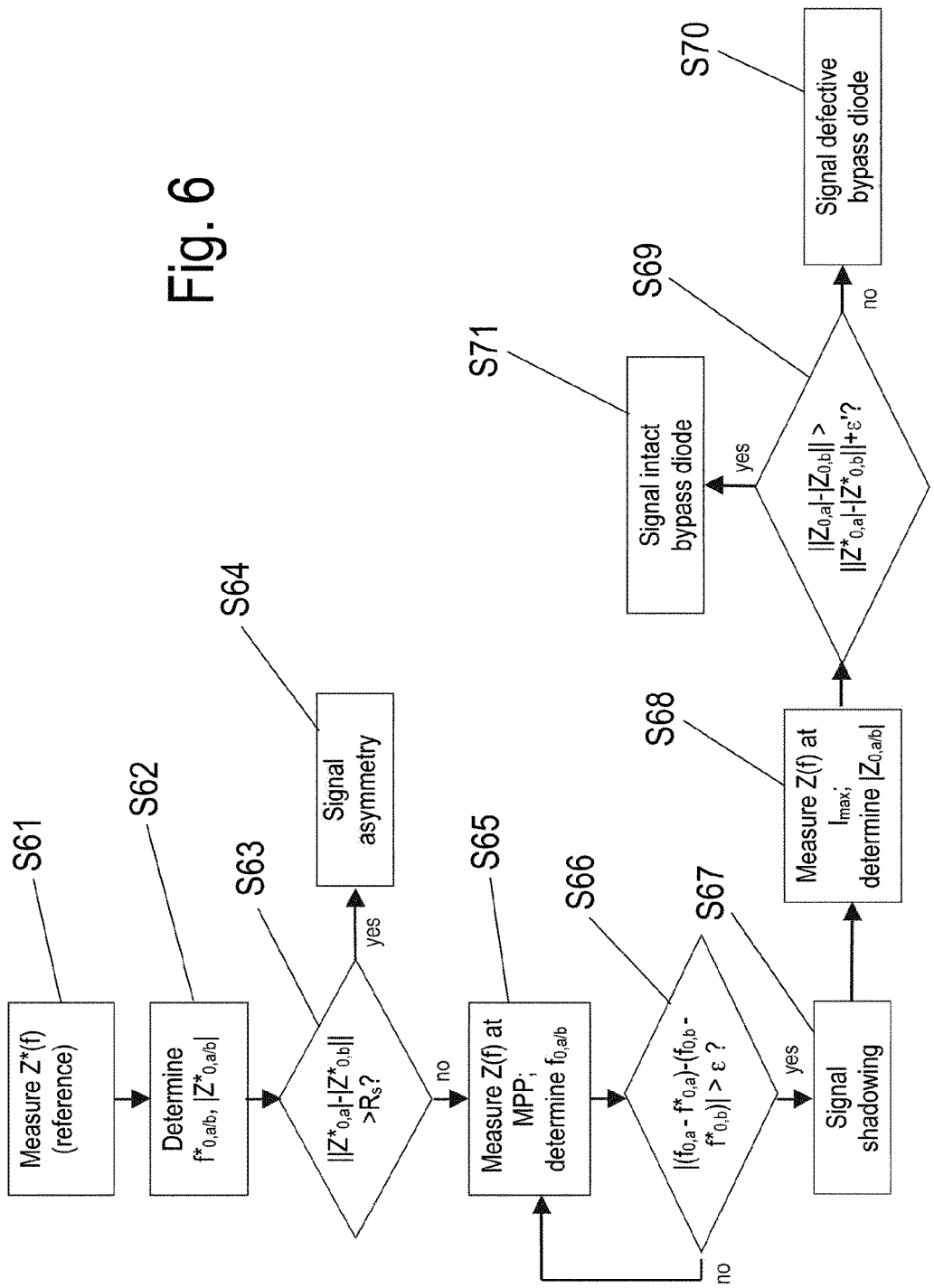
FIG. 6 shows a flowchart of a method for signaling partial shadowing in a second example embodiment.

The method according to FIG. 6 begins with acts S61 to S66 in exactly the same manner as the method according to FIG. 2 begins with acts S21 to S26. Reference is made to the explanations in connection with FIG. 2.

After the criterion based on the resonant frequency shift has been satisfied at S66, the detected partial shadowing is immediately signaled at S67 in the method shown in FIG. 6. Acts S68 and S69 which correspond to acts S27 and S28 according to FIG. 2 are then carried out.

However, in contrast to the example embodiment in FIG. 2, the measurement and analysis of the resonant impedances in the short-circuit case of the PV generator 10 are not used to verify the result found in act S26 or S66, but rather are interpreted in another manner. The aim of the measurement is now control for the correct functionality of the bypass diodes of shadowed PV modules. This can be implemented in a simple manner, for example, by means of deliberately induced partial shadowing of individual strings. In this case, the partial shadowing is deliberately induced and is obvious. In another case, the partial shadowing is not deliberately induced. However, it is ensured in another manner that the shadowing remains constant and does not change at least during acts S65 to S69. The extent to which the comparison of the resonant impedances of a partially shadowed string with an unshadowed string reflects the activated bypass diodes of the shadowed string is now analyzed.

If act S69 therefore shows that the absolute value of the differences between the resonant impedances in the short-circuit case is not greater than the absolute value of the differences between the reference resonant impedances, this indicates a defect of bypass diodes within the shadowed partial PV generator. This is signaled at S70. If, in contrast, the criterion at S69 has been satisfied, it is not possible to infer a defect of the bypass diodes and the method branches to S71 in which correspondingly intact bypass diodes are signaled. From both acts S70, S71, provision can then be made for the method to branch back to S65 again and to be repeatedly carried out from this point on, for example with the deliberately induced shadowing of other PV modules.

In the example embodiments in FIGS. 2 and 6, the magnitude of the complex impedance was considered to be a resonant property in order to be evaluated from the measured values. However, the evaluation may be based on any desired characteristic variable of the complex impedance at the point of resonance, for example its real part, its imaginary part or its phase.

The invention claimed is:

1. A method for signaling partial shadowing within a PV generator comprising at least two partial PV generators connected in parallel, comprising:
   performing a reference impedance measurement on each of the at least two partial PV generators in a state of substantially uniform irradiation of the PV generator;
   determining at least one reference resonant property of each of the at least two partial PV generators from the reference impedance measurement;
   performing impedance measurements on each of the at least two partial PV generators at a first operating point of the PV generator during operation of the PV generator;
   determining at least one resonant property of each of the partial PV generators from the impedance measurements, and
   detecting and signaling partial shadowing within the PV generator if a difference between the resonant properties of the partial PV generators at the first operating point differs from a difference between the reference resonant properties of the partial PV generators.

2. The method as claimed in claim 1, wherein the reference resonant property or the resonant property is a reference resonant frequency or a resonant frequency.

3. The method as claimed in claim 1, wherein the reference resonant property or the resonant property is a reference resonant impedance or a resonant impedance.

4. The method as claimed in claim 1, wherein a reference impedance measurement is performed on each of the at least two partial PV generators in darkness.

5. The method as claimed in claim 1, wherein partial shadowing within the PV generator is detected and signaled only when a difference between the resonant properties of the partial PV generators at the first operating point differs from a difference between the reference resonant properties of the partial PV generators by at least one tolerance value.

6. The method as claimed in claim 1, wherein a difference between the reference resonant impedances of two partial PV generators is used as a basis for determining that there is an asymmetry in the number of PV modules within the partial PV generators.

7. The method as claimed in claim 1, further comprising:
performing further impedance measurements on the at least two partial PV generators at a second operating point of the PV generator close to a short circuit during operation of the PV generator, and
determining resonant properties of the partial PV generators from the impedance measurements at the second operating point.

8. The method as claimed in claim 7, wherein partial shadowing is detected and signaled only:
when a difference in the resonant frequency of the partial PV generators at the first operating point differs from the corresponding difference between the reference resonant frequencies, and
when a difference in the resonant impedance of the partial PV generators at the second operating point differs from the corresponding difference in the reference resonant impedance.

9. The method as claimed in claim 7, wherein a defect in at least one bypass diode within PV modules of the PV generator is determined if the absolute value of the difference in the resonant impedance of the partial PV generators at the second operating point is equal to or less than the corresponding difference in the reference resonant impedance.

10. The method as claimed in claim 7, wherein a defect in at least one bypass diode within PV modules of the PV generator is signaled if the absolute value of the difference in the resonant impedance of the partial PV generators at the second operating point is equal to or less than the corresponding difference in the reference resonant impedance.

11. The method as claimed in claim 1, wherein the at least two partial PV generators comprise more than two partial PV generators connected in parallel, wherein the difference between the resonant properties or the reference resonant properties being compared in pairs in each case for two of the partial PV generators.

12. The method as claimed in claim 1, wherein a first impedance measurement is carried out at the first operating point or a second operating point, or both, of the partial PV generators on the basis of a first number of supporting points, and wherein resonant properties are determined once from the first impedance measurement and wherein their temporal changes in the subsequent measurements are tracked using a tracking method, and wherein a subsequent measurement is made using a second, lesser number of supporting points.

13. The method as claimed in claim 1, wherein a difference between the reference resonant impedances of two partial PV generators is used as a basis for signaling that there is an asymmetry in the number of PV modules within the partial PV generators.

14. An apparatus for signaling partial shadowing within a PV generator comprising at least two partial PV generators connected in parallel, comprising:
means for measuring impedances of the partial PV generators;
means for determining at least one resonant property of each of the partial PV generators using the measured impedances; and
means for determining partial shadowing within the PV generator system based on the resonant properties of the partial PV generators determined at two different operating conditions.

15. The apparatus as claimed in claim 14, wherein the partial shadow determining means is configured to evaluate resonant properties of the partial PV generators in a state of substantially uniform irradiation and at a first operating point of the PV generator system as the two different operating conditions.

16. The apparatus as claimed in claim 14, wherein the impedance measuring means comprises:
an AC signal generator;
a coupling-in circuit configured to couple in an AC signal from the AC signal generator into each of the parallel connected partial PV generators;
a coupling-out circuit configured to couple out an AC signal from each of the parallel connected partial PV generators in response to the coupled-in AC signal; and
a control circuit configured to measure an impedance of the partial PV generators based on the coupled-out AC signals.

17. The apparatus as claimed in claim 16, wherein the control circuit is arranged in an inverter for a PV installation.

18. The apparatus as claimed in claim 16, wherein the coupling-in circuit comprises a transformer in one of the DC current paths of the apparatus.

19. The apparatus as claimed in claim 16, wherein the coupling-out circuit comprises a transformer in each respective path of the parallel connected partial PV generators.

20. The apparatus as claimed in claim 19, wherein the coupling-out circuit further comprises an amplifier circuit connected to each transformer, and operable to amplify a signal induced in a secondary winding thereof.

* * * * *